(12) United States Patent
Inamoto et al.

(10) Patent No.: US 8,194,414 B2
(45) Date of Patent: Jun. 5, 2012

(54) SENSOR DEVICE FOR OCCUPANT PROTECTION SYSTEM

(75) Inventors: Takashi Inamoto, Nagoya (JP); Tatsuki Tanaka, Nagoya (JP)

(73) Assignee: Denso Corporation, Kariya (JP)

( * ) Notice: Subject to any disclaimer, the term of this patent is extended or adjusted under 35 U.S.C. 154(b) by 317 days.

(21) Appl. No.: 12/590,975

(22) Filed: Nov. 17, 2009

(65) Prior Publication Data
US 2010/0157558 A1    Jun. 24, 2010

(30) Foreign Application Priority Data

Dec. 18, 2008 (JP) .................................. 2008-322601

(51) Int. Cl.
*H05K 7/00* (2006.01)
(52) U.S. Cl. ........................................ 361/777; 361/760
(58) Field of Classification Search .................. 361/777, 361/760; 174/262
See application file for complete search history.

(56) References Cited

U.S. PATENT DOCUMENTS

| | | | |
|---|---|---|---|
| 6,670,830 B2 | 12/2003 | Otsuka et al. | |
| 7,190,188 B2 | 3/2007 | Otsuka et al. | |
| 7,397,322 B2 | 7/2008 | Hamada et al. | |
| 2007/0233919 A1* | 10/2007 | Miura | 710/110 |
| 2008/0078571 A1* | 4/2008 | Imaoka et al. | 174/262 |

FOREIGN PATENT DOCUMENTS

| | | |
|---|---|---|
| JP | 2001-015925 | 1/2001 |
| JP | 2001-211211 | 8/2001 |
| JP | 2001-267701 | 9/2001 |
| JP | 2005-051496 | 2/2005 |
| JP | 2005-277546 | 10/2005 |
| JP | 2008-109094 | 5/2008 |
| JP | 2008-294795 | 12/2008 |
| JP | 2010-081340 | 4/2010 |

* cited by examiner

*Primary Examiner* — Yuriy Semenenko
(74) *Attorney, Agent, or Firm* — Harness, Dickey & Pierce, PLC

(57) ABSTRACT

A sensor device includes a communication line having a high-level line and a low-level line, and printed wiring layers. The printed wiring layers are connected to the communication line so as to have a differential communication with an electronic control unit of an occupant protection system. First and second layers are ungrounded, and have a low-level conduction pattern connected to the low-level line and a circuit element having a standard corresponding to the low-level line. Third printed wiring layer is arranged between the first and second layers through insulations, and has a high-level conduction pattern connected to the high-level line.

10 Claims, 4 Drawing Sheets

SENSOR DEVICE FOR OCCUPANT PROTECTION SYSTEM

CROSS REFERENCE TO RELATED APPLICATION

This application is based on Japanese Patent Application No. 2008-322601 filed on Dec. 18, 2008, the disclosure of which is incorporated herein by reference in its entirety.

BACKGROUND OF THE INVENTION

1. Field of the Invention

The present invention relates to a sensor device used for an occupant protection system.

2. Description of Related Art

As shown in FIG. 5A, an occupant protection system includes a sensor device 120, and an electronic control unit 115 (ECU) connected to the sensor device 120 through a low level communication line VL and a high level communication line VH. When a voltage of the low line VL is constant, and when a voltage of the high line VH oscillates, radiation noise is generated from the high line VH.

When a differential voltage/current communication is performed between the low line VL and the high line VH, the radiation noise is decreased.

The sensor device 120 includes a communication part 117, a sensor part 118 and a capacitor 119. The communication part 117 communicates with the ECU 115, and the sensor part 118 is connected to the communication part 117. A power supply line and a ground line connect the communication part 117 and the sensor part 118, and the capacitor 119 is arranged between the power supply line and the ground line.

When a predetermined communication is performed between the ECU 115 and the communication part 117, the sensor device 120 is activated by electricity charged in a capacitor 121 located between the low line VL and the communication part 117. When the predetermined communication is in an idle state, the sensor device 120 is activated by electricity supplied from the ECU 115. The ECU 115 controls the sensor device 120 to perform analog-digital conversion relative to a signal output from the sensor part 118, and to send the converted data to the ECU 115 through the communication part 117.

As shown in FIG. 5B, a phase of a high level signal waveform VHs of the high line VH is made opposite from that of a low level signal waveform VLs of the low line VL, in a communication between the ECU 115 and the sensor device 120. Thus, the radiation noise is reduced, because the waveform VLs is canceled by the waveform VHs having the opposite phase.

JP-A-2005-277546 discloses a communication apparatus. Radiation noise generated from a communication line of the communication apparatus is similarly reduced.

However, a sensor device connected to an ECU is not grounded, in the communication apparatus. A circuit element of the sensor device is connected to the low line VL as a standard. Further, a conduction pattern of the sensor device is connected to the low line VL. If radiation noise is generated from the circuit element and the conduction pattern, an amplitude modulation (AM) band of an in-vehicle radio may be affected by the radiation noise.

SUMMARY OF THE INVENTION

In view of the foregoing and other problems, it is an object of the present invention to provide a sensor device for an occupant protection system.

According to a first example of the present invention, a sensor device includes a communication line, a first ungrounded printed wiring layer, a second ungrounded printed wiring layer, and a third ungrounded printed wiring layer. The communication line has a high level line and a low level line to be connected to an electronic control unit of an occupant protection system. The first ungrounded printed wiring layer is connected to the communication line so as to have a differential communication with the electronic control unit. The first printed wiring layer has a first low level conduction pattern connected to the low line, and a first circuit element having a standard corresponding to the low line. The second ungrounded printed wiring layer is connected to the communication line so as to have a differential communication with the electronic control unit. The second printed wiring layer has a second low level conduction pattern connected to the low line, and a second circuit element having a standard corresponding to the low line. The third printed wiring layer is arranged between the first printed wiring layer and the second printed wiring layer through insulation layers. The third printed wiring layer has a high-level conduction pattern connected to the high line.

Accordingly, radiation noise can be reduced.

According to a second example of the present invention, a sensor device includes a communication line and an ungrounded multilayer printed wiring. The communication line has a high level line and a low level line to be connected to an electronic control unit of an occupant protection system. The multilayer printed wiring is connected to the communication line so as to have a differential communication with the electronic control unit. The multilayer printed wiring has a low-level conduction pattern connected to the low line, a circuit element having a standard corresponding to the low line, and a high-level conduction pattern connected to the high line. The low-level conduction pattern and the circuit element are arranged in a first predetermined area of the multilayer printed wiring, and the high-level conduction pattern is arranged in a second predetermined area different from the first predetermined area.

Accordingly, radiation noise can be reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

Figure 1:
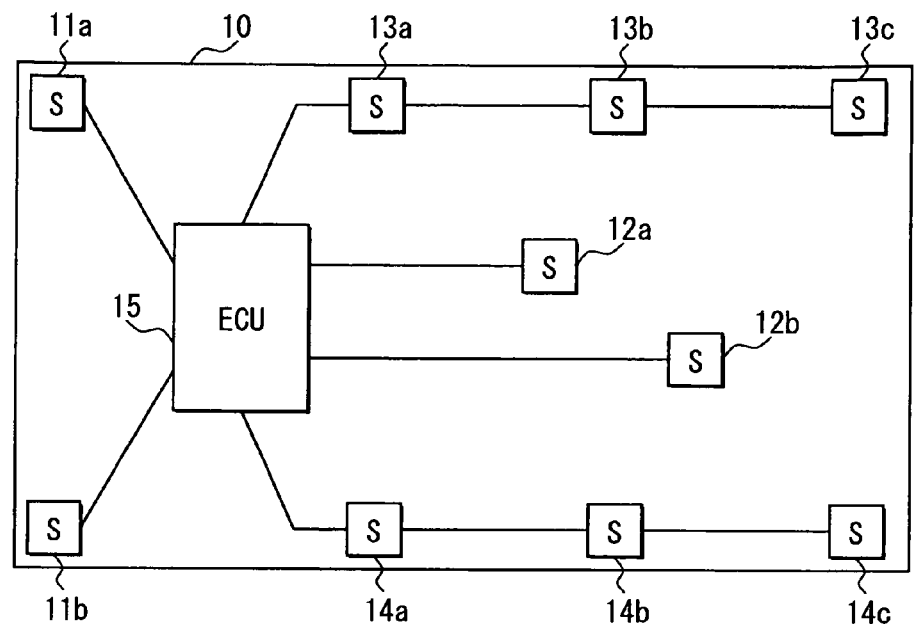
FIG. 1 is a schematic diagram illustrating an occupant protection system.

As shown in FIG. 1, a vehicle 10 has an occupant protection system including front sensor devices 11a, 11b, safety sensor devices 12a, 12b, lateral sensor devices 13a, 13b, 13c, 14a, 14b, 14c, and an electronic control unit 15 (ECU) connected to the sensor devices 11a-14c.

The front sensor device 11a, 11b is fixed to a front lateral part of the vehicle 10. The safety sensor device 12a, 12b is located adjacent to a passenger seat or back seat of the vehicle 10. The lateral sensor device 13a-14c is located to a lateral side of the vehicle 10. When the vehicle 10 has a collision, acceleration is detected by the sensor device 11a-14c, and an occupant protection device (not shown) such as airbag or seatbelt pretensioner mounted in the vehicle 10 is activated by the ECU 15 based on the detected acceleration.

Figure 2:
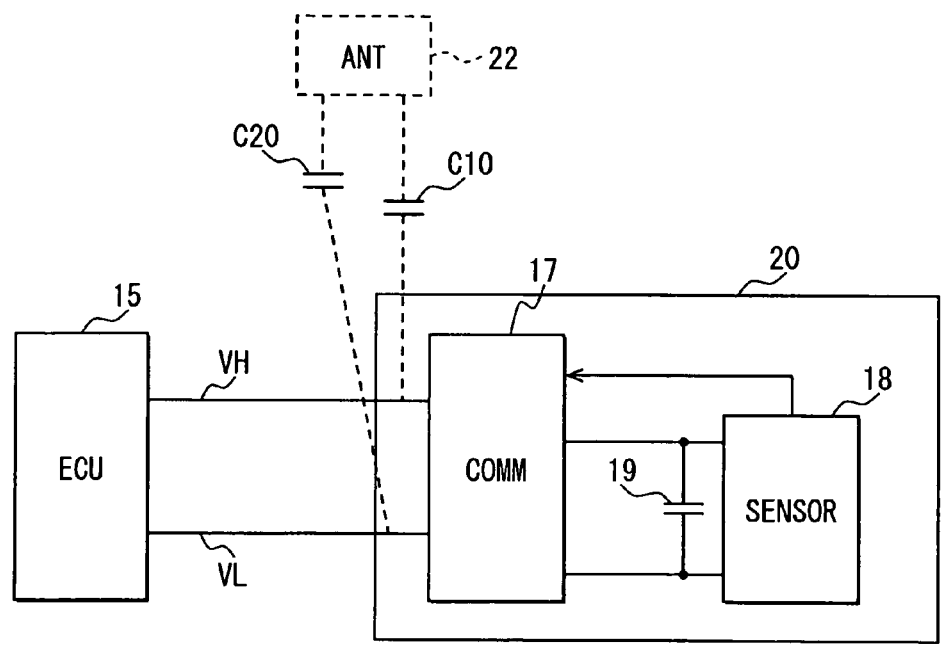
FIG. 2 is a schematic circuit diagram illustrating a sensor device according to an embodiment.

As shown in FIG. 2, a sensor device 20 is connected to the ECU 15 through a low level communication line VL and a high level communication line VH, and a differential voltage/current communication is performed. The sensor device 20 corresponds to the sensor device 11a-14c.

The sensor device 20 includes a communication part 17, a sensor part 18 and a capacitor 19. The communication part 17 communicates with the ECU 15, and the sensor part 18 is connected to the communication part 17. The sensor part 18 has a standard corresponding to the low level communication line VL, and the capacitor 19 is arranged for power supply stability.

Figure 3A:
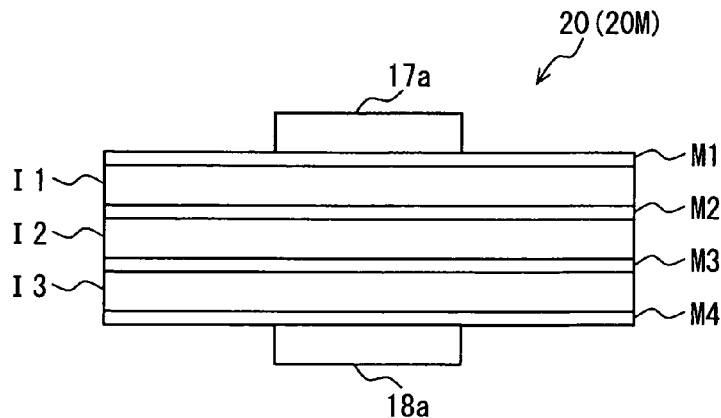
FIG. 3A is a schematic side view illustrating a multilayer printed wiring of the sensor device.

As shown in FIG. 3A, the sensor device 20 includes a first printed wiring layer M1, a second printed wiring layer M2, a third printed wiring layer M3 and a fourth printed wiring layer M4, which are layered to be parallel with each other. A circuit element 17a is mounted to the first layer M1, and a circuit element 18a is mounted to the fourth layer M4. An insulation layer I1 is arranged between the layers M1, M2. An insulation layer I2 is arranged between the layers M2, M3. An insulation layer I3 is arranged between the layers M3, M4. The insulation layer I1, I2, I3 is made of glass epoxy board, for example.

As shown in FIGS. 3B, 3C, 3D and 3E, through hole terminals C1, C2, C3, C4 are defined in the layer M1, M2, M3, M4, and blind via holes C5, C6, C7 are defined in the layer M1, M4. The through hole terminals C1, C2, C3, C4 and the via holes C5, C6, C7 pass through the insulation layer so as to connect conduction patterns arranged on the layers.

Figure 3B:
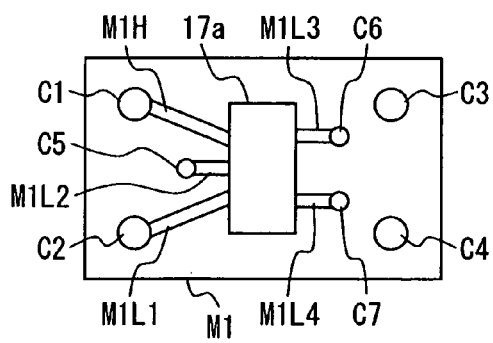
FIG. 3B is a schematic plan view illustrating a first wiring layer.

As shown in FIG. 3B, the first layer M1 has conduction patterns M1H, M1L1, M1L2, M1L3, M1L4. An end of the pattern M1H is connected to the terminal C1, and is in high level. An end of the pattern M1L1 is connected to the terminal C2, and is in low level. An end of the pattern M1L2 is connected to the via hole C5, and is in low level. An end of the pattern M1L3 is connected to the via hole C6, and is in low level. An end of the pattern M1L4 is connected to the via hole C7, and is in low level. The other end of the pattern M1H, M1L1, M1L2, M1L3, M1L4 is connected to the circuit element 17a. The circuit element 17a defines the communication part 17 shown in FIG. 2, and is in low level.

Figure 3D:
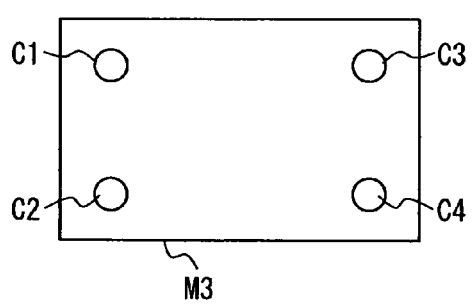
FIG. 3D is a schematic plan view illustrating a third wiring layer.
Figure 3C:
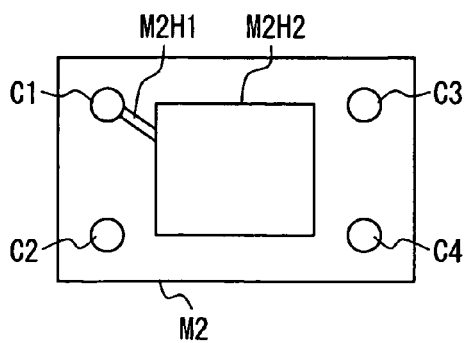
FIG. 3C is a schematic plan view illustrating a second wiring layer.

As shown in FIG. 3C, the second layer M2 has conduction patterns M2H1, M2H2. An end of the pattern M2H1 is connected to the terminal C1, and is in high level. The pattern M2H2 is connected to the other end of the pattern M2H1. As shown in FIG. 3D, only the terminals C1, C2, C3, C4 are defined in the third layer M3.

Figure 3E:
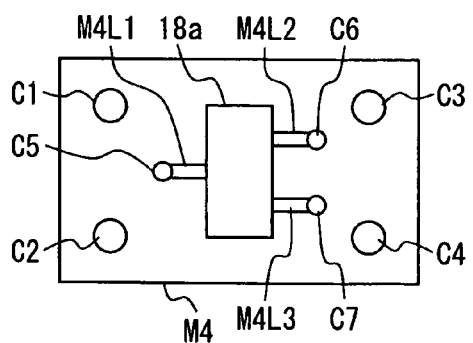
FIG. 3E is a schematic plan view illustrating a fourth wiring layer.

As shown in FIG. 3E, the fourth layer M4 has conduction patterns M4L1, M4L2, M4L3. An end of the pattern M4L1 is connected to the via hole C5, and is in low level. An end of the pattern M4L2 is connected to the via hole C6, and is in low level. An end of the pattern M4L3 is connected to the via hole C7, and is in low level. The other end of the pattern M4L1, M4L2, M4L3 is connected to the circuit element 18a. The circuit element 18a defines the sensor part 18 shown in FIG. 2, and is in low level.

A sensor multilayer printed wiring 20M is defined by the printed wiring layers M1, M2, M3, M4 and the insulation layers I1, I2, I3 disposed between the printed wiring layers M1, M2, M3, M4.

The high level conduction pattern M2H2 of the second layer M2 connected to the high line VH through the terminal C1 and the conduction pattern M2H1 has a plane area S1. The plane area S1 is made approximately equal to a total area S2 of plain areas of the low level conduction patterns M1L1, M1L2, M1L3, M1L4, M4L1, M4L2, M4L3 and the low level circuit elements 17a, 18a of the first and fourth layers M1, M4.

Further, the high level conduction pattern M2H2 is located to approximately oppose to the low level conduction patterns M1L1, M1L2, M1L3, M1L4, M4L1, M4L2, M4L3 and the low level circuit elements 17a, 18a in an up-and-down direction of FIG. 3A.

Formula 1 represents a charge variation $\Delta Q1$ of the high level communication line VH when a signal voltage of the high level communication line VH is varied by $\Delta V$.

$$\Delta Q1 = C10 \times \Delta V = \in \times S1 \times \Delta V / d1 \qquad \text{Formula 1}$$

As shown in a broken line of FIG. 2, a coupling capacitance C10 is defined between an in-vehicle antenna 22 and the conduction pattern M2H2 connected to the high line VH. The capacitance C10 has a dielectric constant $\in$. The high level conduction pattern M2H2 has the area S1, and a distance d1 is defined between the antenna 22 and the conduction pattern M2H2.

The sensor device 20 performs the differential voltage/current communication with the ECU 15. Therefore, when the signal voltage of the high level communication line VH is varied by $\Delta V$, a signal voltage of the low level communication line VL is varied by $-\Delta V$. At this time, Formula 2 represents a charge variation $\Delta Q2$ of the low level communication line VL.

$$\Delta Q2 = C20 \times -\Delta V = \in \times S2 \times -\Delta V / d2 \qquad \text{Formula 2}$$

As shown in the broken line of FIG. 2, a coupling capacitance C20 is defined between the in-vehicle antenna 22 and the conduction pattern connected to the low line VL. The capacitance C20 has a dielectric constant $\in$. The low level conduction pattern M1L1, M1L2, M1L3, M1L4, M4L1, M4L2, M4L3 and the circuit elements 17a, 18a have the total area S2, and a distance d2 is defined between the antenna 22 and the conduction pattern.

Formula 3 represents a charge variation $\Delta Q$ of the multilayer printed wiring 20M constructing the sensor device 20.

$$\Delta Q = \Delta Q1 + \Delta Q2 = \in \times \Delta V \times (S1/d1 - S2/d2) \qquad \text{Formula 3}$$

When a distance between the antenna 22 and the multilayer printed wiring 20M is long, the distance d1 and the distance d2 are approximately equal to each other.

$$\Delta Q = \in \times \Delta V \times (S1 - S2) / d1 \qquad \text{Formula 4}$$

Figure 4A:
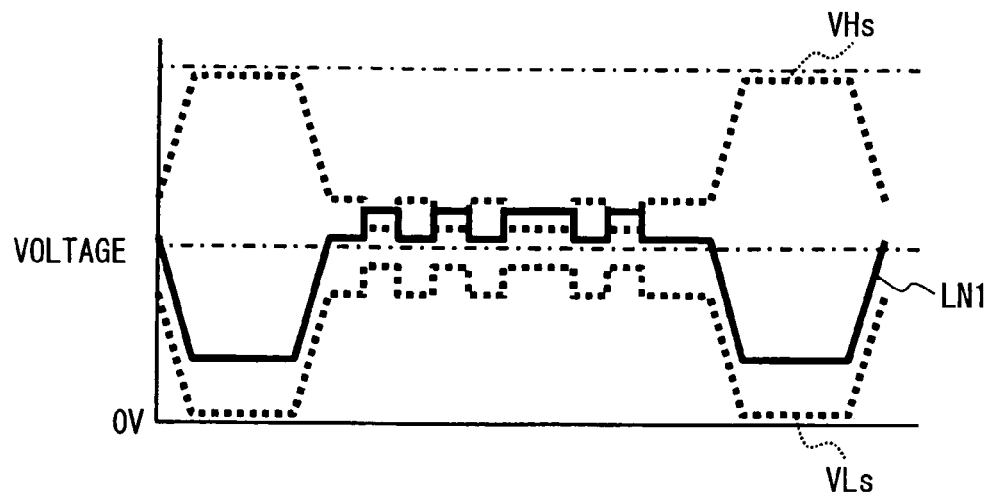
FIG. 4A is a schematic waveform illustrating radiation noise.

Because an electric field is generated by the charge variation $\Delta Q$ of the multilayer printed wiring 20M, radiation noise LN1 shown in FIG. 4A is generated. The radiation noise LN1 generated from the multilayer printed wiring 20M can be reduced by decreasing the charge variation $\Delta Q$.

According to the embodiment, the plane area S1 of the high level conduction pattern M2H2 is made approximately equal to the total area S2 of the low level conduction patterns M1L1, M1L2, M1L3, M1L4, M4L1, M4L2, M4L3 and the low level circuit elements 17a, 18a. Therefore, the charge variation ΔQ can be made smaller.

Further, the high level conduction pattern M2H2 is located to approximately oppose to the low level conduction patterns M1L1, M1L2, M1L3, M1L4, M4L1, M4L2, M4L3 and the low level circuit elements 17a, 18a in the up-and-down direction of FIG. 3A. Therefore, the radiation noise LN1 can be effectively canceled, because noise generated from the low level conduction patterns opposes to signal generated from the high level conduction pattern.

Figure 4B:
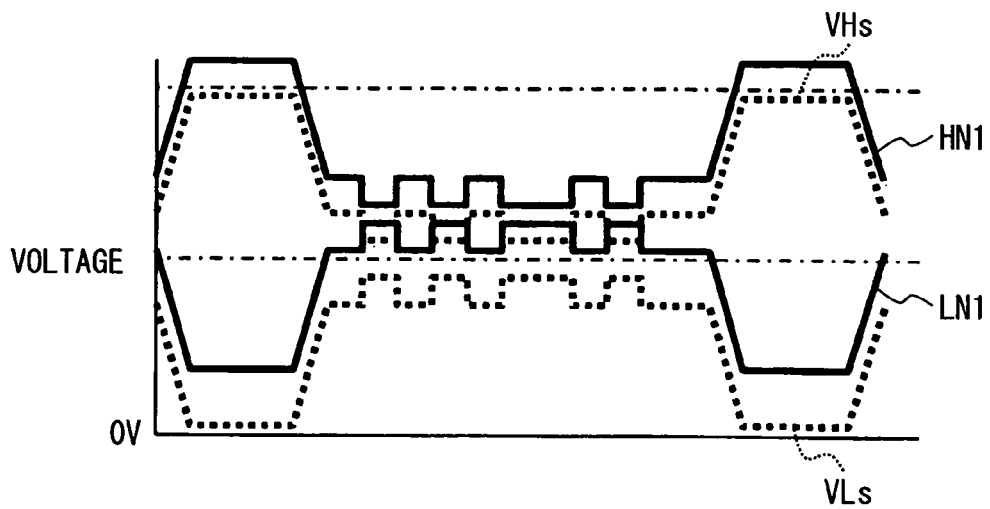
FIG. 4B is a schematic waveform illustrating a signal for canceling the radiation noise.
Figure 5A:
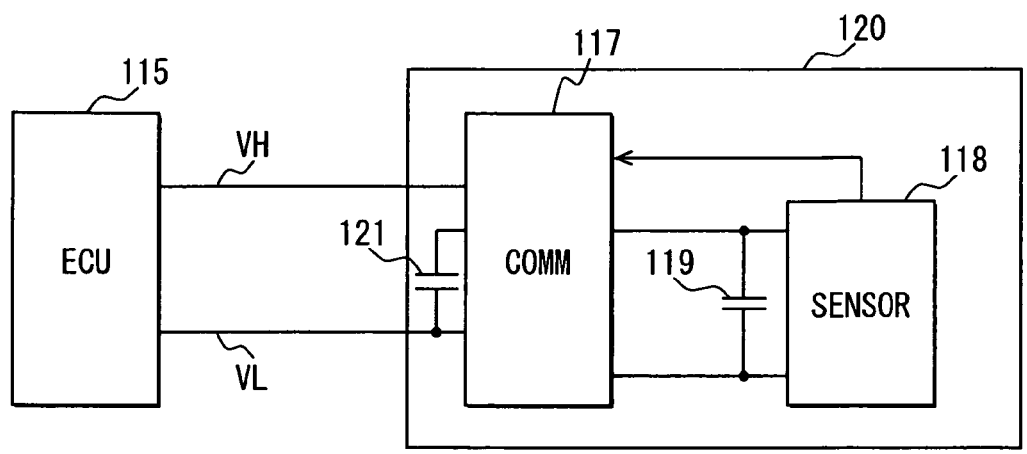
FIG. 5A is a schematic circuit diagram illustrating a conventional sensor device.
Figure 5B:
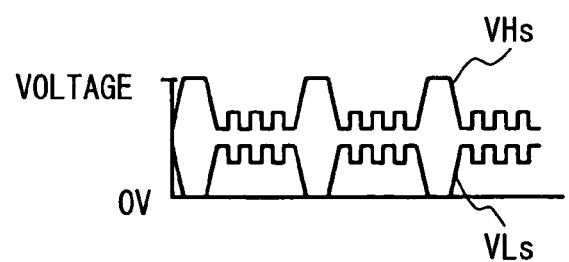
FIG. 5B is a schematic waveform illustrating signals between the conventional sensor device and an electronic control unit.

Therefore, as shown in FIG. 4B, radiation signal HN1 having a phase opposite from the radiation noise LN1 is generated from the high level conduction pattern M2H2. The radiation signal HN1 approximately cancels the radiation noise LN1. The charge variation ΔQ of the multilayer printed wiring 20M becomes small, and the radiation noise LN1 generated from the sensor device 20 is reduced. Thus, amplitude modulation (AM) band of an in-vehicle radio can be less affected.

When the plane area S1 of the high level conduction pattern M2H2 is made approximately equal to the total area S2 of the low level conduction patterns M1L1, M1L2, M1L3, M1L4, M4L1, M4L2, M4L3 and the low level circuit elements 17a, 18a, the high level conduction pattern M2H2 may not be located to approximately oppose to the low level conduction patterns M1L1, M1L2, M1L3, M1L4, M4L1, M4L2, M4L3 and the low level circuit elements 17a, 18a. In this case, the radiation noise LN1 generated from the sensor device 20 can be reduced.

The multilayer printed wiring 20M includes the layer M2 having the conduction pattern M2H2. Alternatively, a high level conduction pattern may be arranged in a free area of the layer M1, M4 other than an area having the low level conduction patterns M1L1, M1L2, M1L3, M1L4, M4L1, M4L2, M4L3 and the low level circuit elements 17a, 18a. In this case, the radiation noise LN1 can be reduced.

Such changes and modifications are to be understood as being within the scope of the present invention as defined by the appended claims.

What is claimed is:

1. A sensor device connectable to an electronic control unit (ECU) of an occupant protection system that protects an occupant in a vehicle when the vehicle has a collision comprising:
  a communication line having a high level line and a low level line;
  an ungrounded multilayer printed wiring having a plurality of wiring layers and connected to the communication line so as to have a differential communication with the electronic control unit; and
  an insulation layer interposed between each of the wiring layers in the multilayer printed wiring, wherein the multilayer printed wiring includes
    a low level conduction pattern connected to the low level line, and
    a circuit element that operates in accordance with a standard corresponding to the low level line, and
    a predetermined printed wiring interposed in a space of the multilayer printed wiring through the insulation layer, and the predetermined printed wiring has a high-level conduction pattern connected at only one end to the high level line.

2. The sensor device according to claim 1, wherein an area of the high-level conduction pattern of the predetermined printed wiring layer is equal to a sum of an area of the low level conduction pattern and an area of the circuit element.

3. The sensor device according to claim 1, wherein the high-level conduction pattern is located to partially overlap with the low-level conduction pattern and the circuit element.

4. The sensor device according to claim 1, wherein the high-level conduction pattern is located opposed to the low-level conduction pattern.

5. The sensor device according to claim 1, wherein the low-level conduction pattern resides in a given wiring layer and the high-level conduction pattern is located in a free area of the given wiring layer.

6. The sensor device according to claim 1, wherein the high-level conduction pattern is an antenna having an open end so as to intentionally radiate noise.

7. A sensor device connectable to an electronic control unit (ECU) of an occupant protection system that protects an occupant in a vehicle when the vehicle has a collision comprising:
  a communication line having a high level line and a low level line;
  an ungrounded multilayer printed wiring having a plurality of wiring layers and connected to the communication line so as to have a differential communication with the electronic control unit; and
  an insulation layer interposed between each of the wiring layers in the multilayer printed wiring, wherein the multilayer printed wiring includes
    a low-level conduction pattern connected to the low level line, and
    a circuit element that operates in accordance with a standard corresponding to the low level line, the low-level conduction pattern and the circuit element are arranged in a first predetermined area of the multilayer printed wiring, and
  a high-level conduction pattern connected at only one end to the high level line and arranged in a second predetermined area different from the first predetermined area.

8. The sensor device according to claim 7, wherein the high-level conduction pattern is located opposed to the low-level conduction pattern.

9. The sensor device according to claim 7, wherein the low-level conduction pattern resides in a given wiring layer and the high-level conduction pattern is located in a free area of the given wiring layer.

10. The sensor device according to claim 7, wherein the high-level conduction pattern is an antenna having an open end so as to intentionally radiate noise.

* * * * *